US011227925B2

(12) United States Patent
Tang et al.

(10) Patent No.: US 11,227,925 B2
(45) Date of Patent: Jan. 18, 2022

(54) SEMICONDUCTOR DEVICE AND CHARGING SYSTEM USING THE SAME

(71) Applicant: PTEK TECHNOLOGY CO., LTD., Hsinchu (TW)

(72) Inventors: Ming Tang, Hsinchu (TW); Shih Ping Chiao, Hsinchu (TW)

(73) Assignee: PTEK TECHNOLOGY CO., LTD., Hsinchu (TW)

( * ) Notice: Subject to any disclaimer, the term of this patent is extended or adjusted under 35 U.S.C. 154(b) by 536 days.

(21) Appl. No.: 15/858,746

(22) Filed: Dec. 29, 2017

(65) Prior Publication Data

US 2018/0301554 A1 Oct. 18, 2018

Related U.S. Application Data

(60) Provisional application No. 62/485,709, filed on Apr. 14, 2017.

(51) Int. Cl.
*H01L 29/423* (2006.01)
*H01L 27/02* (2006.01)
(Continued)

(52) U.S. Cl.
CPC ...... *H01L 29/4236* (2013.01); *H01L 27/0255* (2013.01); *H01L 27/0266* (2013.01); *H01L 29/1045* (2013.01); *H01L 29/7825* (2013.01); *H01L 29/7835* (2013.01); *H02J 7/007184* (2020.01); *H01L 29/1095* (2013.01); *H01L 29/7813* (2013.01); *H02J 7/00302* (2020.01)

(58) Field of Classification Search
None
See application file for complete search history.

(56) References Cited

U.S. PATENT DOCUMENTS 5,640,034 A * 6/1997 Malhi ............... H01L 29/42368
257/330
6,351,009 B1 * 2/2002 Kocon ................ H01L 29/0696
257/328
(Continued)

FOREIGN PATENT DOCUMENTS

CN 1327288 A 12/2001
CN 101364610 A 2/2009
(Continued)

OTHER PUBLICATIONS

Office Action issued in corresponding CN application No. 201810224530.2 dated Nov. 2, 2020.
(Continued)

*Primary Examiner* — Steven B Gauthier
(74) *Attorney, Agent, or Firm* — Muncy, Geissler, Olds & Lowe, P.C.

(57) ABSTRACT

The present disclosure provides a semiconductor device. The semiconductor device includes a transistor. The transistor includes a first source/drain (S/D) region, a second S/D region and a gate structure. The first S/D region is defined in a first well on a double diffusion layer, wherein the first well and the double diffusion layer define a diode at a junction therebetween, wherein an anode of the diode and the first S/D region form an open circuit therebetween. The gate structure is between the first S/D region and the second S/D region.

18 Claims, 15 Drawing Sheets

(51) Int. Cl.
*H01L 29/10* (2006.01)
*H01L 29/78* (2006.01)
*H02J 7/00* (2006.01)

(56) References Cited

U.S. PATENT DOCUMENTS 6,690,559 B2　　2/2004　Yoshida
2020/0203353 A1*　6/2020　Liu .................. H01L 27/10876

FOREIGN PATENT DOCUMENTS

| | | |
|---|---|---|
| JP | S60-154671 | 8/1985 |
| JP | H0335534 A | 2/1991 |
| JP | H0697450 B2 | 11/1994 |
| JP | 2001-352683 | 12/2001 |
| JP | 2001352683 A | 12/2001 |
| JP | 2013004539 A | 1/2013 |
| JP | 2014049481 A | 3/2014 |
| JP | 2014049481 A | 3/2014 |
| TW | 495951 | 5/2001 |

OTHER PUBLICATIONS

Office Action and Cited References dated Jun. 9, 2021 issued by the Japanese Patent Office for counterpart application No. 2020-065972 (provided with brief translation).

* cited by examiner

SEMICONDUCTOR DEVICE AND CHARGING SYSTEM USING THE SAME

This application claims priority of U.S. provisional application Ser. No. 62/485,709 filed on Apr. 14, 2017, which is incorporated by reference in its entirety.

TECHNICAL FIELD

The present disclosure relates to a semiconductor device, and more particularly, to a semiconductor device including a trench MOS-gated device.

DISCUSSION OF THE BACKGROUND

A MOS transistor that includes a trench gate structure offers important advantages over a planar transistor for high current, low voltage switching applications.

This Discussion of the Background section is for background information only. The statements in this Discussion of the Background are not an admission that the subject matter disclosed in this section constitutes a prior art to the present disclosure, and no part of this section may be used as an admission that any part of this application, including this Discussion of the Background section, constitutes prior art to the present disclosure.

SUMMARY

One aspect of the present disclosure provides a semiconductor device. The semiconductor device includes a transistor. The transistor includes a first source/drain (S/D) region, a second S/D region and a gate structure. The first S/D region is defined in a first well on a double diffusion layer, wherein the first well and the double diffusion layer define a diode at a junction therebetween, wherein an anode of the diode and the first S/D region forms an open circuit therebetween. The gate structure is between the first S/D region and the second S/D region.

In some embodiments, the first well is free of a body region of the transistor.

In some embodiments, the semiconductor device is free of the body region of the transistor.

In some embodiments, the semiconductor device is free of a conductive layer on the first S/D region.

In some embodiments, the second S/D region is defined in a second well on the double diffusion layer, wherein the second S/D region has the same dopant type as the second well.

In some embodiments, the second S/D region has the same dopant type as the double diffusion layer, and the first well has a dopant type opposite to that of the double diffusion layer.

In some embodiments, the first S/D region has an n-type dopant, the first well has a p-type dopant, the double diffusion layer has an n-type dopant, the second well has an n-type dopant, and the second S/D region has an n-type dopant.

In some embodiments, the first S/D region is level with the second S/D region.

In some embodiments, the first well has a dopant type opposite to that of the second well.

Another aspect of the present disclosure provides a semiconductor device. The semiconductor device includes a transistor. The transistor includes a first source/drain (S/D) region, a second S/D region and a gate structure. The first S/D region in a first well on a double diffusion layer. The first well and the double diffusion layer are defined in a substrate. The first well has a dopant type opposite to that of the double diffusion layer. The first S/D region is entirely defined in a portion of the first well in proximity to a top surface of the substrate. The gate structure is between the first S/D region and the second S/D region.

In some embodiments, the first well has a dopant type opposite to that of the first S/D region.

In some embodiments, the second S/D region is defined in a second well on the double diffusion layer, wherein the second S/D region has the same dopant type as the second well and the double diffusion layer.

In some embodiments, the first well has a dopant type opposite to that of the second well.

In some embodiments, the first S/D region is level with the second S/D region.

In some embodiments, the first S/D region has an n-type dopant, the first well has a p-type dopant, the double diffusion layer has are n-type dopant, the second well has an n-type dopant, and the second S/D region has an n-type dopant.

Another aspect of the present disclosure provides a charging system. The charging system includes the transistor; a battery; and a control device configured to, in response to a battery voltage of the battery, control a conductive state of the transistor.

In some embodiments, when the battery voltage exceeds a threshold voltage, the control device controls the transistor to be not conducting.

In some embodiments, when the battery voltage is lower than a threshold voltage, the control device controls the transistor to be not conducting.

In some embodiments, the control device includes only one output port connected to the transistor.

Although a diode is defined at a junction between the first well and the double diffusion layer, in the absence of the body region and the conductive layer, the anode of the diode is not short-circuited to the first S/D region, which means that the anode and the first S/D region form an open circuit. As such, the diode does not provide a conduction path between the double diffusion layer and the first S/D region, or between the second S/D region and the first S/D region. As a result, even though a charging system adopts only one transistor, an over-charge protection mechanism and an over-discharge protection mechanism of the charging system still function normally. Moreover, because no body region is required, a semiconductor manufacturing process is relatively simple.

In contrast, with a comparative power MOS transistor, because of limitation of the semiconductor structure of the comparative power MOS transistor, to avoid failure of an over-charge protection mechanism and an over-discharge protection mechanism, two power MOS transistors are required. Moreover, to control two power MOS transistors, a design of the charging system is relatively complicated.

The foregoing has outlined rather broadly the features and technical advantages of the present disclosure in order that the detailed description of the disclosure that follows may be better understood. Additional features and technical advantages of the disclosure are described hereinafter, and from the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be connected to the figures' reference numbers, which refer to similar elements throughout the description, and:

DETAILED DESCRIPTION

Figure 1:
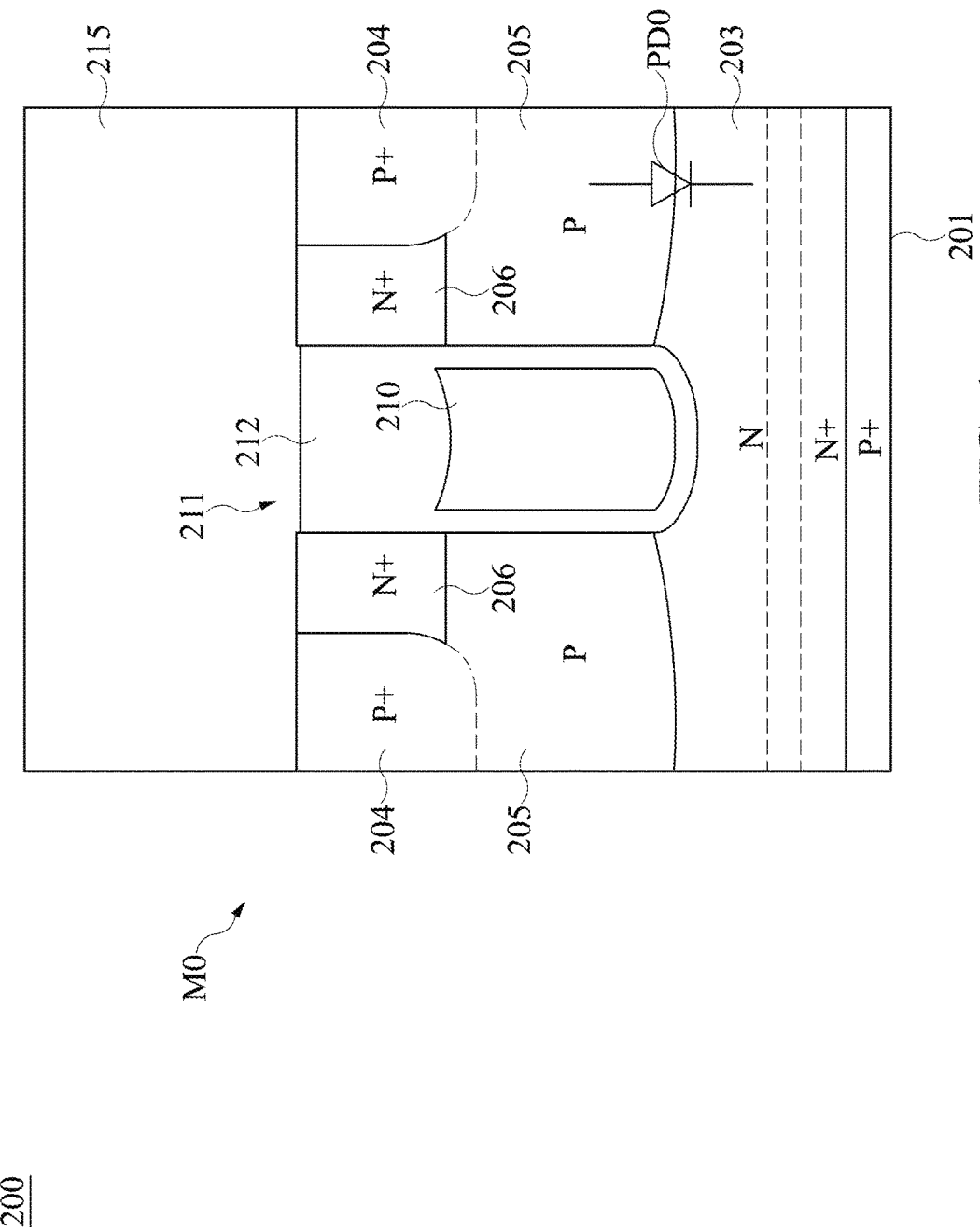
FIG. 1 is a cross-sectional view of a semiconductor device including a comparative n-type power metal-oxide-semiconductor (MOS).

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that when an element is referred to as being "connected to" or "coupled with" another element, the initial element may be directly connected to, or coupled to, another element, or to other intervening elements.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a cross-sectional view of a semiconductor device 200 including a comparative power metal-oxide-semiconductor (MOS) transistor M0. Referring to FIG. 1, the power MOS transistor M0 includes an n-type source region 206 in a p-well region 205 in a substrate 201 of the semiconductor device 200, an n-type drain region 203 in the substrate 201, a gate structure 211 formed of a gate material 210 and a dielectric layer 212, and a p-type body region 204 in the p-well region 205. Dopant types of the source region 206, the p-well region 205 and the drain region 203 define the power MOS transistor M0 as an n-type power MOS transistor.

Generally, a body of a power MOS transistor is required to be biased so as to control a voltage level of the body, thereby, for example, controlling a threshold voltage of the power MOS transistor. In some existing approaches, to bias the body, the body is short-circuited to a source of the power MOS transistor. For such reasons, as illustrated in FIG. 1, the body region 204 is short-circuited to the source region 206 via a metal layer 215 of the semiconductor device 200.

Moreover, the p-well region 205 and the drain region 203 have opposite dopant types. As such, a parasitic diode PD0 is defined at a junction therebetween. In further detail, the p-well region 205 and the drain region 203 serve as an anode and a cathode, respectively, of the parasitic diode PD0.

The p-well region 205 and the body region 204 have the same dopant type. As such, the anode of the parasitic diode PD0 is short-circuited to the body region 204, and further short-circuited to the source region 206 via the metal layer 215. In summary, the anode and the cathode of the parasitic diode PD0 are coupled to the source region 206 and the drain region 203, respectively. As such, the parasitic diode PD0 provides a conduction path between the source region 206 and the drain region 203 when the parasitic diode PD0 is conducting, which would cause failure of an over-discharge protection mechanism and an over-charge protection mechanism of a charging system applied with only one power MOS transistor M0, as will be described in detail with reference to FIGS. 4 and 6.

Figure 2:
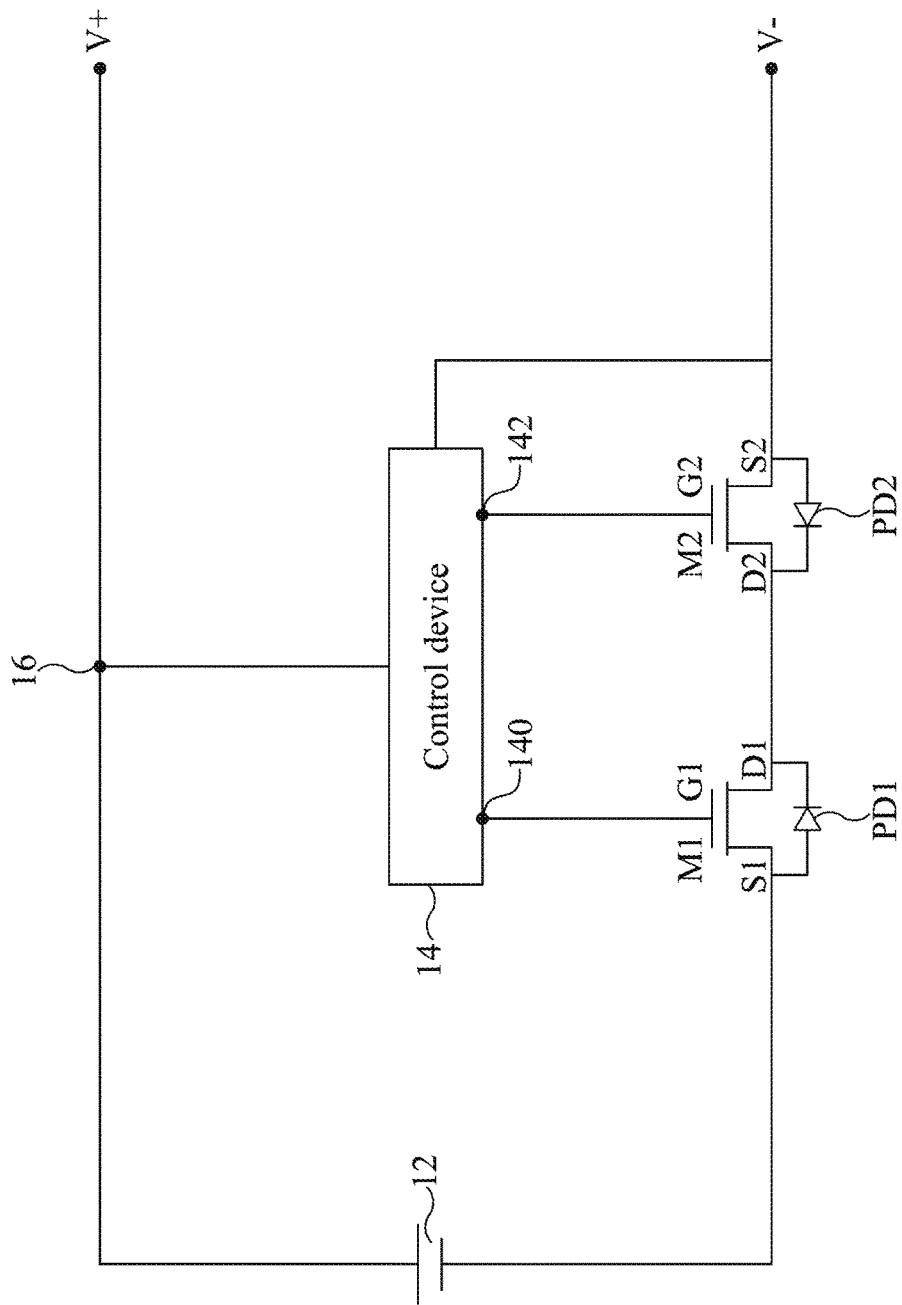
FIG. 2 is a schematic diagram of a charging system including the comparative power MOS shown in FIG. 1.

FIG. 2 is a schematic diagram of a charging system 10 including two comparative power MOS transistors M0 of FIG. 1. Referring to FIG. 2, for clarity of illustration, one of the power MOS transistors M0 is denoted M1, and the other one of the power MOS transistors M0 is denoted M2. The charging system 10 includes a control device 14 and a battery 12 in addition to two power MOS transistors M1 and M2.

Moreover, the power MOS transistor M1 includes a source S1, a drain D1, and a gate G1. Similarly, the power MOS transistor M2 includes a source S2, a drain D2, and a gate G2. Additionally, the parasitic diodes PD0 are individually denoted. PD1 and PD2.

An anode and a cathode of the parasitic diode PD1 are coupled to the source S1 and the drain D1, respectively, of the power MOS transistor M1. Additionally, an anode and a cathode of the parasitic diode PD2 are coupled to the source S2 and the drain D2, respectively, of the power MOS transistor M2.

The drain D1 of the power MOS transistor M1 is coupled to the drain D2 of the power MOS transistor M2. Consequently, the power MOS transistor M1 and the power MOS transistor M2 together form a common drain structure.

The control device 14 functions to control conductive states of the power MOS transistors M1 and M2 in response to a battery voltage of the battery 12. In some operations, the control device 14 determines the battery voltage based on a voltage level at a node 16 of the charging system 10. In further detail, the control device 14 has two output ports 140 and 142. The control device 14 controls the power MOS transistors M1 and M2 by transmitting control signals at its output ports 140 and 142 to the power MOS transistors M1 and M2, respectively. An approach to controlling the power MOS transistors M1 and M2 will be described in detail with reference to FIGS. 3 to 6.

Figure 3:
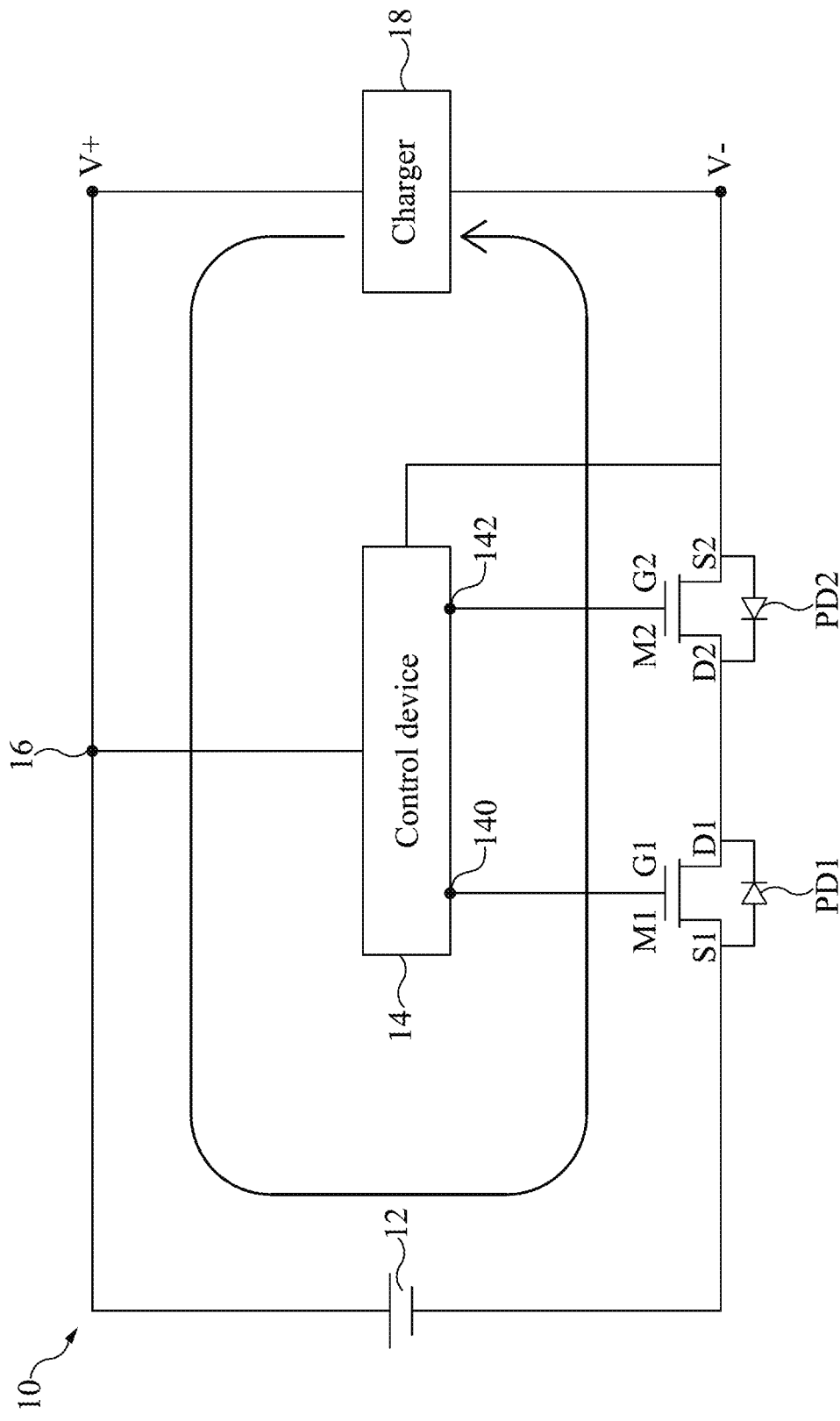
FIG. 3 is a schematic diagram illustrating a charging behavior of the charging system shown in FIG. 2.

FIG. 3 is a schematic diagram illustrating a charging behavior of the charging system 10 shown in FIG. 2. Referring to FIG. 3, a charger 18 is adapted to the charging system 10 at ports V+ and V− of the charging system 10. In operation, the control device 14 controls the power MOS transistors M1 and M2 to be conducting. As such, a closed loop is formed, and the charger 18 charges the battery 12.

Figure 4:
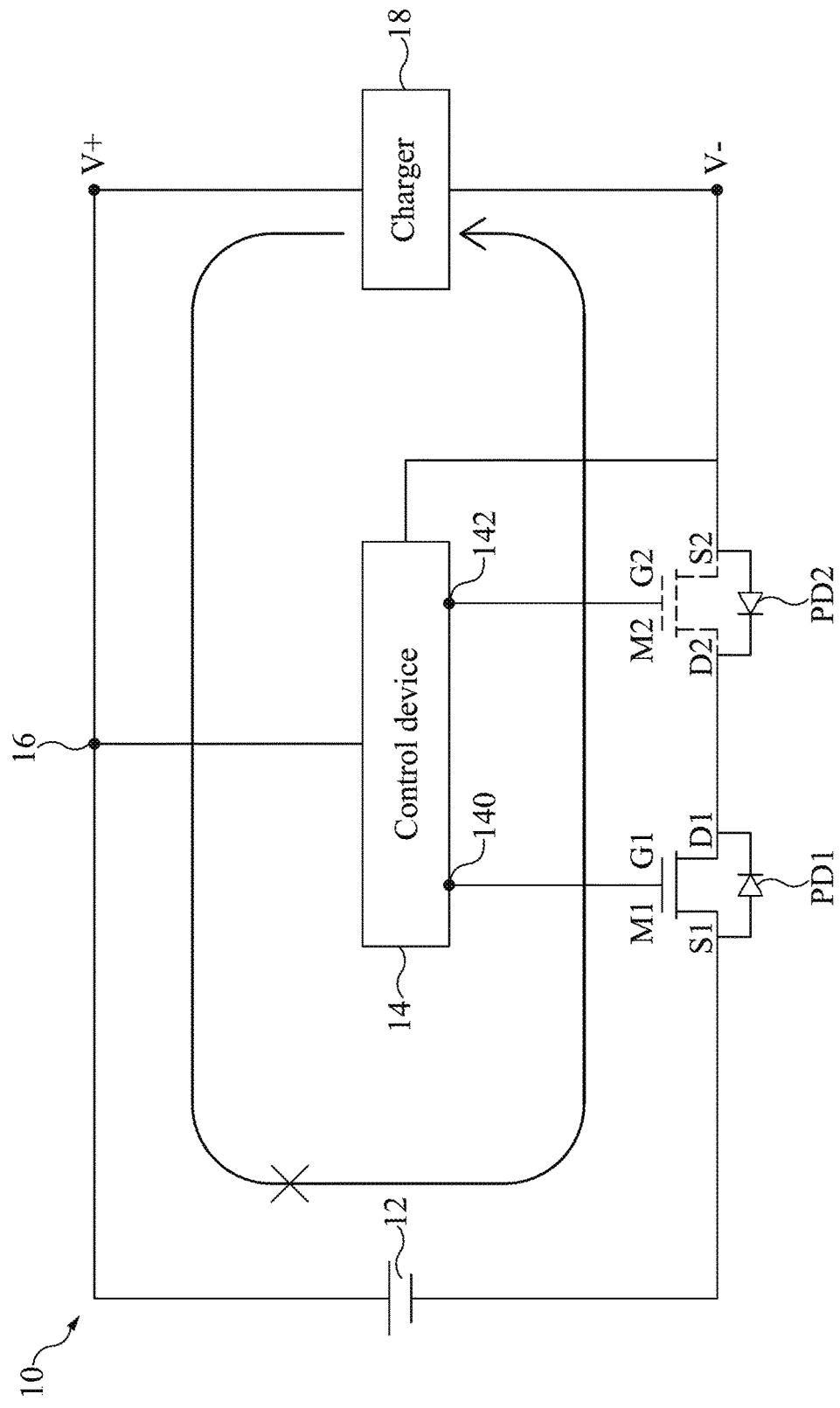
FIG. 4 is a schematic diagram illustrating an over-charge protection mechanism of the charging system shown in FIG. 2.

FIG. 4 is a schematic diagram illustrating an over-charge protection mechanism of the charging system 10 shown in FIG. 2. Referring to FIG. 4, the control device 14 determines that the battery voltage exceeds a threshold voltage, which means that an undesired over-charge circumstance may occur. As such, to activate the over-charge protection mechanism, the control device 14 functions to break the closed loop by controlling the power MOS transistor M2 to be not conducting, and, in some operations, by controlling both the power MOS transistors M1 and M2 to be not conducting.

In some operations, even though the power MOS transistor M1 is controlled to be not conducting, the power MOS transistor M1 may still provide a conduction path. In further detail, the anode and the cathode of the parasitic diode PD1 are coupled to an anode having a relatively high voltage level and a cathode having a relatively low voltage level of the charger 18, respectively. As such, the parasitic diode PD1 is conducting. As a result, the power MOS transistor M1 provides a conduction path through the parasitic diode PD1.

Moreover, when the power MOS transistor M2 is controlled to be not conducting, the power MOS transistor M2 is actually not conducting. No conduction path is provided by the power MOS transistor M2. In further detail, the anode and the cathode of the parasitic diode PD2 are coupled to a cathode having a relatively low voltage level and an anode having a relatively high voltage level of the charger 18, respectively. As such, the parasitic diode PD2 is not conducting. As a result, no conduction path is provided by the parasitic diode PD2.

Since the closed loop is broken, the charger 18 stops charging the battery 12. The undesired over-charge circumstance is avoided.

In the charging system 10, two transistors, i.e., the power MOS transistors M1 and M2, are required to complete the over-charge protection mechanism. It is assumed that the power MOS transistor M2 is removed from the charging system 10. The charging system 10 is only applied with a single power MOS transistor M1. The cathode of the parasitic diode PD1 is accordingly coupled to the cathode (i.e., the port V−) of the charger 18. If the control device 14 determines that the undesired over-charge circumstance may occur and therefore the control device 14 controls the power MOS transistors M1 to be not conducting, as previously mentioned the parasitic diode PD1 still provides a conduction path. As such, the closed loop is not broken, and the charger 18 continues charging the battery 12. As a result, the undesired over-charge circumstance eventually occurs.

Moreover, to control the two transistors, the power MOS transistors M1 and M2, a design of the charging system 10 is relatively complicated. For example, the control device 14 has to be configured to have two ports 140 and 142.

Figure 5:
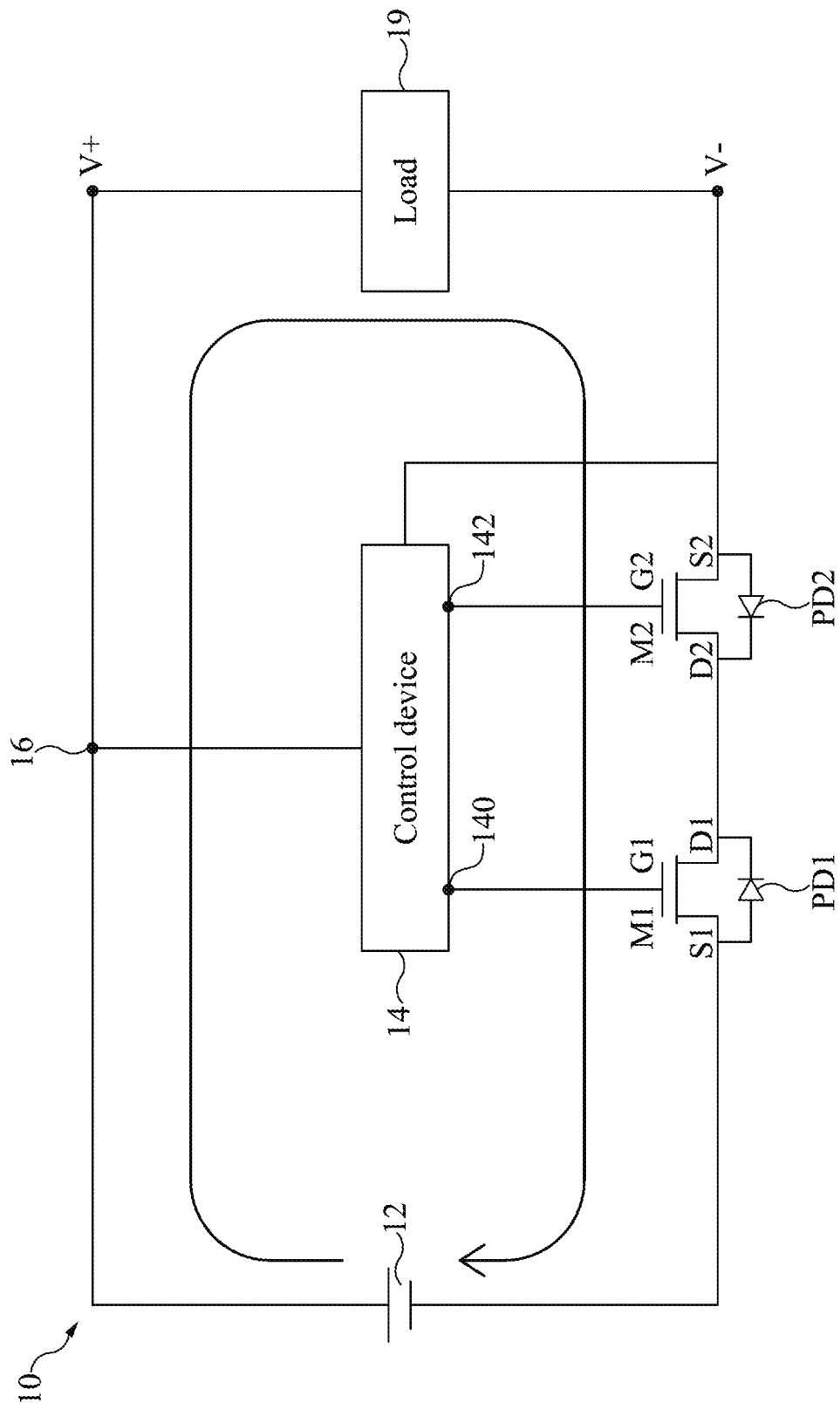
FIG. 5 is a schematic diagram illustrating a discharging behavior of the charging system shown in FIG. 2.

FIG. 5 is a schematic diagram illustrating a discharging behavior of the charging system 10 shown in FIG. 2. Referring to FIG. 5, a load 19 is adapted to the charging system 10 at ports V+ and V− of the charging system 10. The control device 14 controls the power MOS transistors M1 and M2 to be conducting. As such, a closed loop is formed, and the battery 12 discharges so as to charge the load 19.

Figure 6:
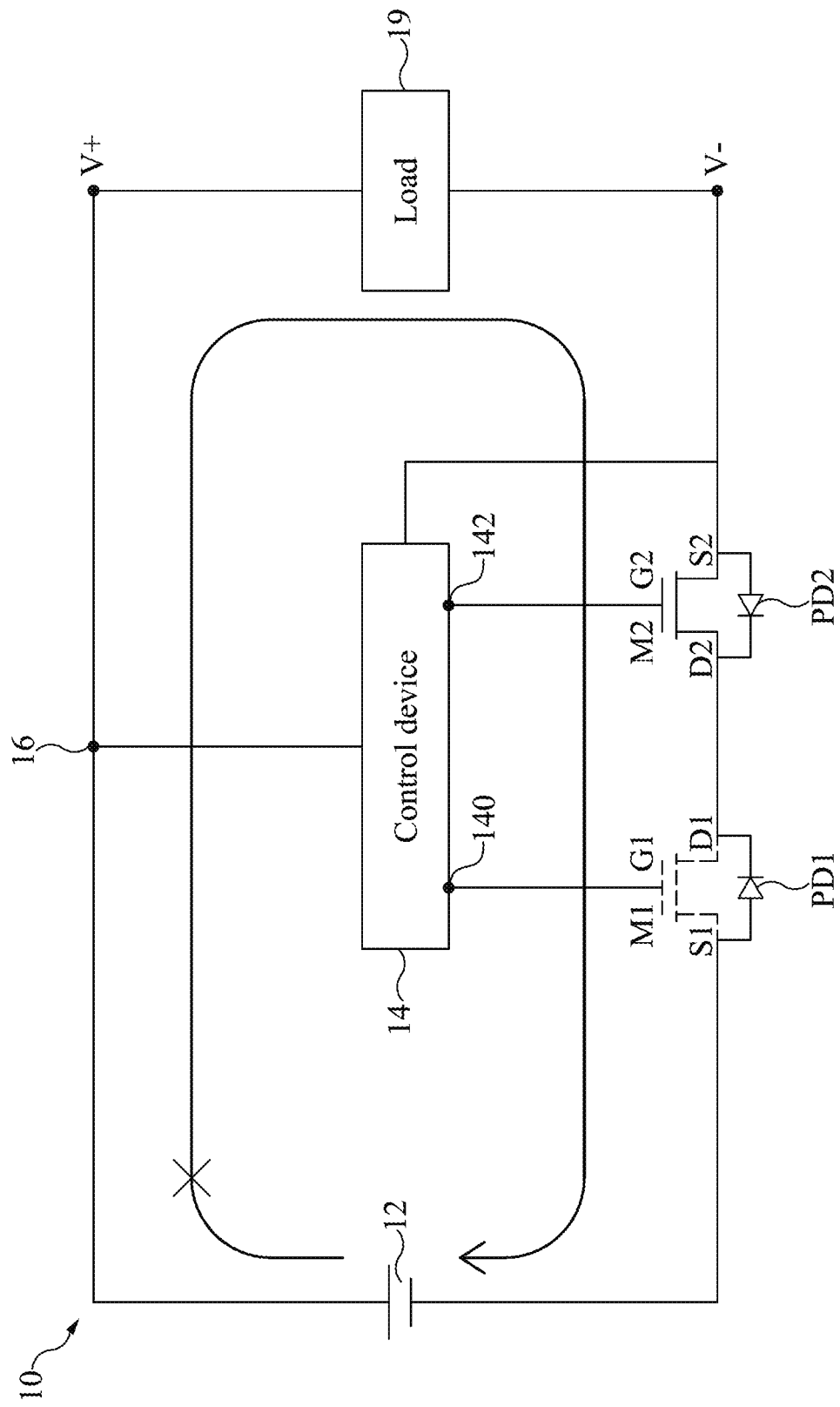
FIG. 6 is a schematic diagram illustrating an over-discharge protection mechanism of the charging system shown in FIG. 2.

FIG. 6 is a schematic diagram illustrating an over-discharge protection mechanism of the charging system 10 shown in FIG. 2. Referring to FIG. 6, the control device 14 determines that the battery voltage is lower than the threshold voltage, which means that an undesired over-discharge circumstance may occur. As such, to activate the over-discharge protection mechanism, the control device 14 functions to break the closed loop by controlling the power MOS transistor M1 to be not conducting, and, in some operations, by controlling both the power MOS transistors M1 and M2 to be not conducting.

In some operations, even though the power MOS transistor M2 is controlled to be not conducting, the power MOS transistor M2 may still provide a conduction path. In further detail, the anode and the cathode of the parasitic diode PD2 are coupled to an anode having a relatively high voltage level and a cathode having a relatively low voltage level of the battery 12, respectively. As such, the parasitic diode PD2 is conducting. As a result, the power MOS transistor M2 provides a conduction path through the parasitic diode PD2.

Moreover, when the power MOS transistor M1 is controlled to be not conducting, the power MOS transistor M1 is actually not conducting. No conduction path is provided. In further detail, the anode and the cathode of the parasitic diode PD1 are coupled to the cathode having a relatively low voltage level and the anode having a relatively high voltage level of the battery 12, respectively. As such, the parasitic diode PD1 is not conducting. As a result, no conduction path is provided.

Since the closed loop is broken, the battery 12 stops discharging. The undesired over-discharge circumstance is avoided.

In the charging system 10, two transistors, i.e., the power MOS transistors M1 and M2, are required to complete the over-discharge protection mechanism. It is assumed that the power MOS transistor M1 is removed from the charging system 10. The charging system 10 is applied with a single power MOS transistor M2. The cathode of the parasitic diode PD2 is accordingly coupled to the cathode of the battery 12. If the control device 14 determines that the undesired over-discharge circumstance may occur and therefore controls the power MOS transistor M2 to be not conducting, as previously mentioned the parasitic diode PD2 still provides a conduction path. As such, the closed loop is not broken, and the battery 12 continues discharging. As a result, the undesired over-discharge circumstance eventually occurs.

In summary, because of the limitation of the semiconductor structure of the power MOS transistor M0, to avoid failure of the over-charge protection mechanism and the over-discharge protection mechanism, two power MOS transistors M0 are required. Moreover, to control two power MOS transistors M0, a design of the charging system 10 is relatively complicated.

Figure 7:
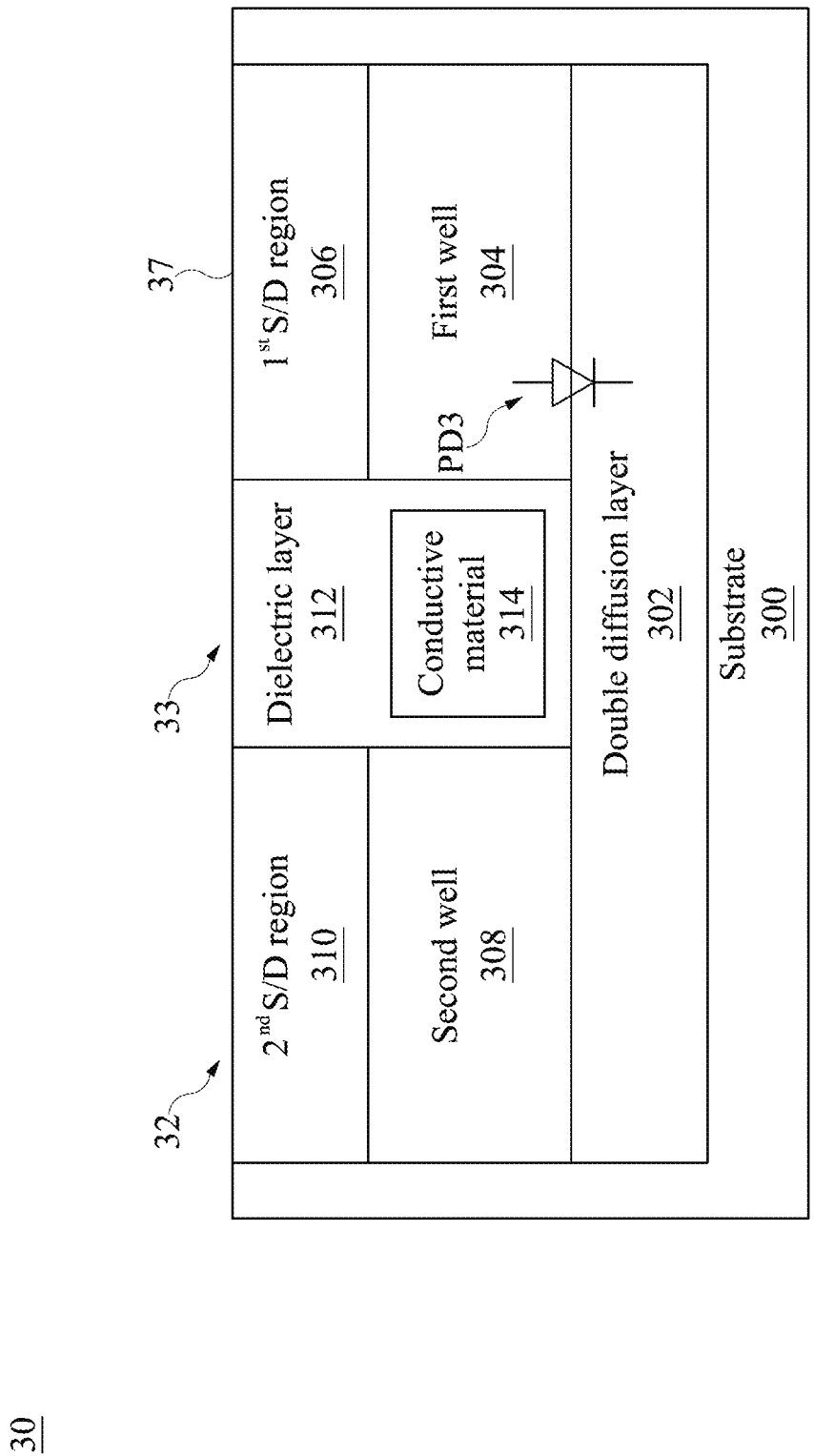
FIG. 7 is a cross-sectional diagram of a semiconductor device including a transistor, in accordance with some embodiments of the present disclosure.

FIG. 7 is a cross-sectional diagram of a semiconductor device 30 including a transistor 32, in accordance with some embodiments of the present disclosure. Referring to FIG. 7, the transistor 32 includes a first source/drain S/D) region 306 defined in a first well 304 in a substrate 300 of the semiconductor device 30, a second S/D region 310 defined in a second well 308 in the substrate 300, and a gate structure 33 formed of a dielectric layer 312 and a conductive material 314. Definitions of regions, wells and other components of the present disclosure can be found in U.S. Utility patent application Ser. No. 13/740,898, filed on Jan. 14, 2013 and entitled "POWER MOSFET DEVICE WITH A GATE CONDUCTOR SURROUNDING SOURCE AND DRAIN PILLARS." This application is incorporated herein by reference.

In the present embodiment, the first S/D region 306 is an n-type region; the first well 304 is a p-type well; a double diffusion layer 302 is an n-type layer in the substrate 300; the second well 308 is an n-type well; and the second S/D region 310 is an n-type region. For convenience, the following discussion will follow such embodiment. However, the present disclosure is not limited thereto. In some embodiments, a dopant type of wells and regions of the semiconductor device 30 is opposite to that of aforesaid embodiment.

The semiconductor device 30 is asymmetrical in dopant type with respect to the gate structure 33. For example, in some embodiments, each of the regions and wells in the semiconductor device 30 has an n-type dopant except for the first well 304 having a p-type dopant.

The gate structure 33 is disposed in a trench of the substrate 300. Consequently, the transistor 32 includes a trench gate structure. Moreover, the gate structure 33 is between the first S/D region 306 and the second S/D region 310. Furthermore, the first S/D region 306 is immediately adjacent to the gate structure 33, which is in turn immediately adjacent to the second S/D region 310.

The first S/D region 306 is at one side of the gate structure 33, and disposed over the double diffusion layer 302 in the substrate 300 of the semiconductor device 30, wherein the double diffusion layer 302 is beneath the first well 304. In further detail, the first S/D region 306 is entirely defined in a portion of the first well 304 in proximity to a top surface 37 of the substrate 300. In an embodiment, the first S/D region. 306 is n-type heavily doped. In some embodiments, the doping concentration in an upper portion of the double diffusion layer 302 is higher than the doping concentration in a lower portion of the double diffusion layer 302.

The second S/D region 310 is at the other side of the gate structure 33, and disposed over the double diffusion layer 302, wherein the double diffusion layer 302 is beneath the second well 308. Additionally, the second S/D region 310 is level with the first S/D region 306. Furthermore, the second S/D region 310 has the same dopant type as the second well 308 and the double diffusion layer 302. As such, the second S/D region 310, the second well 308 and the double diffusion layer 302 can be deemed as together serving as the second S/D region of the transistor 32.

The transistor 32 is free of a body region in the first well 304. Consequently, there is no need to provide a conductive layer, like the metal layer 215 shown in FIG. 1, to connect a nonexistent body region to the first S/D region 306 or the second S/D region 310 so as to bias the nonexistent body region.

The first well 304 and the double diffusion layer 302 have opposite dopant types. As such, a diode PD3 is defined at a junction therebetween. The first well 304 and the double diffusion layer 302 serve as an anode and a cathode, respectively, of the diode PD3. However, in the absence of the body region and the conductive layer, the anode of the diode PD3 is not short-circuited to the first S/D region 306, which means that the anode of the diode PD3 and the first S/D region 306 from an open circuit. As such, the diode PD3 does not provide a conduction path between the double diffusion layer 302 and the first S/D region 306, or between the second S/D region 310 and the first S/D region 306. As a result, even though a charging system only adopts one transistor 32, an over-charge protection mechanism and an over-discharge protection mechanism of the charging system still function normally, as will be described in detail with reference to FIGS. 9 to 12. Moreover, because no body region is required, a semiconductor manufacturing process is relatively simple.

As previously mentioned, in the present embodiment, the second well 308 is an n-type well. In such embodiment, the transistor 32 includes one channel controllable by the gate structure 33. The present disclosure is not limited thereto. In other embodiments, the second well 308 is a p-type well. In such embodiment, the transistor 32 includes two channels controllable by the gate structure 33.

Figure 8:
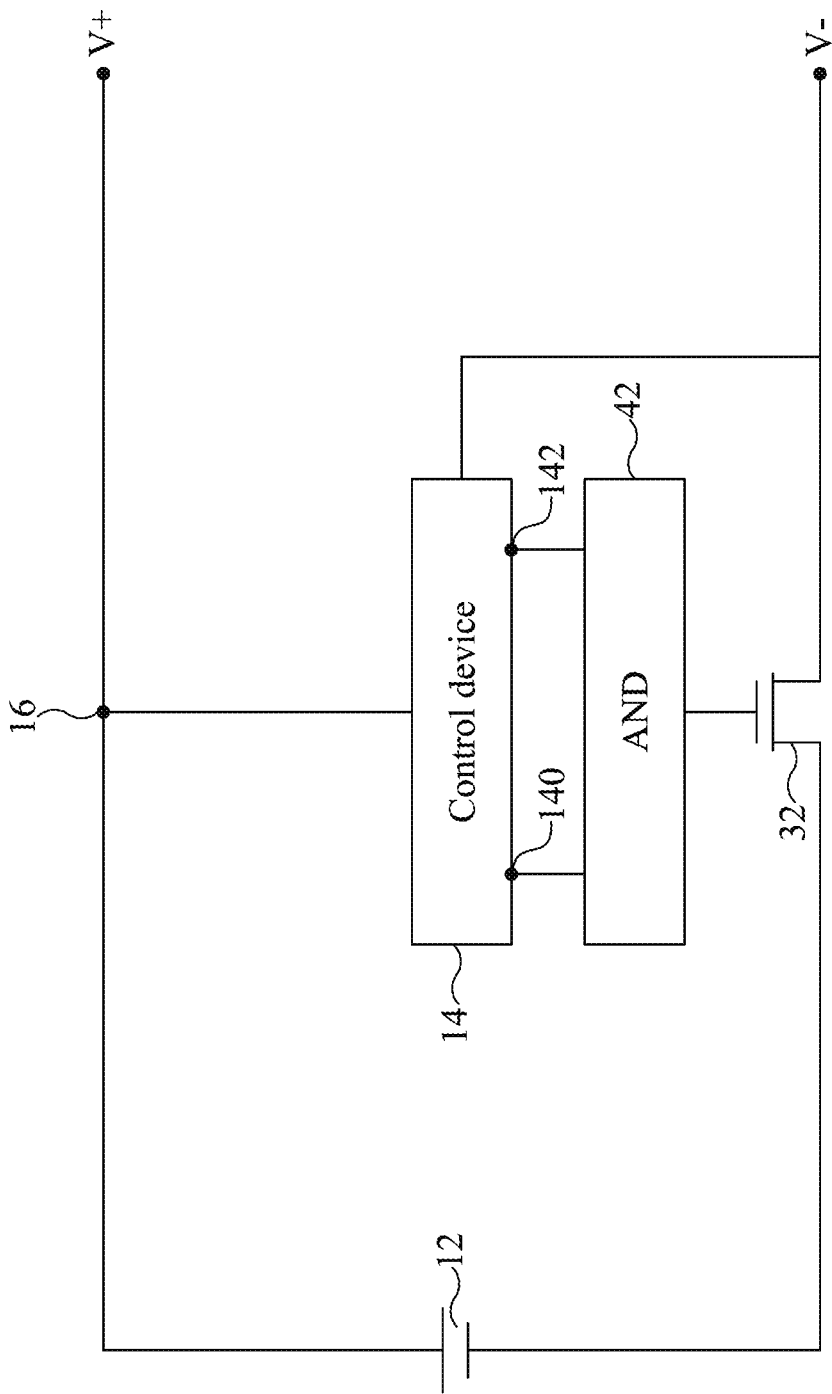
FIG. 8 is a schematic diagram of a charging system applied with the transistor shown in FIG. 7, in accordance with some embodiments of the present disclosure.

FIG. 8 is a schematic diagram of a charging system 40 applied with one transistor 32 shown in FIG. 7, in accordance with some embodiments of the present disclosure. Referring to FIG. 8, the charging system 40 is similar to the charging system 10 described and illustrated with reference to FIG. 2 except that, for example, the charging system 40 includes a logic AND gate 42, in addition to the transistor 32. For convenience of discussion, when discussing a circuit operation of the charging system 40, the first S/D region 306 is called the first S/D 306; and the second S/D region 310 is called the second S/D 310.

The control device 14 functions to control conducting states of the transistor 32 in response to a battery voltage of the battery 12 to activate an over-charge protection mechanism and an over-discharge protection mechanism, as will be described in detail with reference to FIGS. 9 to 12. Since the control device 14 has two output ports 140 and 142, two control signals from the two output ports 140 and 142 are converted into a single control signal by the logic AND gate 42.

Moreover, the control device 14 functions to activate an over-current protection mechanism based on a voltage level at the second S/D 310 of the transistor 32.

Figure 9:
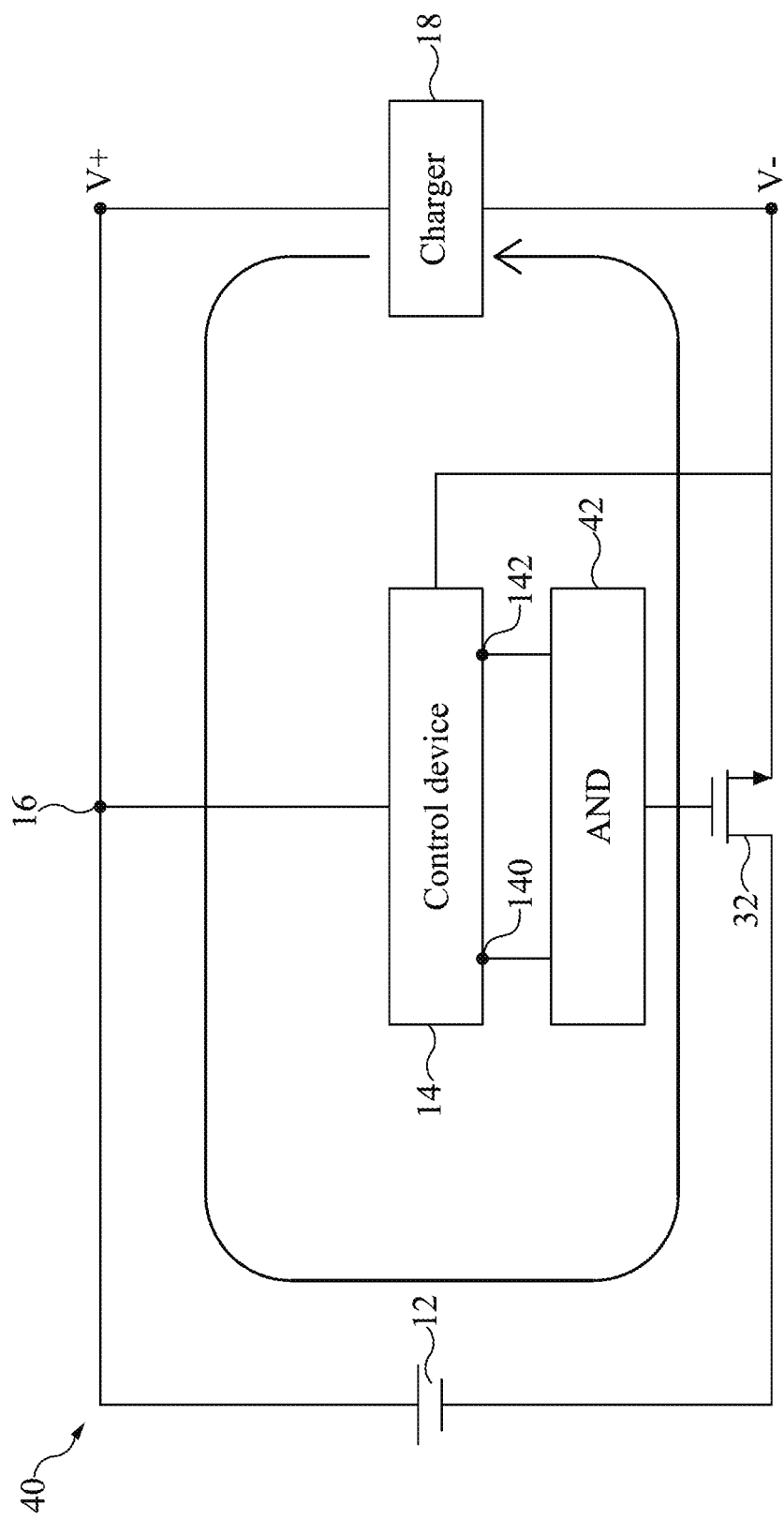
FIG. 9 is a schematic diagram illustrating a charging behavior of the charging system shown in FIG. 8, in accordance with some embodiments of the present disclosure.

FIG. 9 is a schematic diagram illustrating a charging behavior of the charging system 40 shown in FIG. 8, in accordance with some embodiments of the present disclosure. Referring to FIG. 9, a charger 18 is adapted to the charging system 40 at ports V+ and V− of the charging system 40. In operation, to charge the battery 12, the control device 14 controls the transistor 32 to be conducting. As such, a closed loop is formed, and the charger 18 charges the battery 12.

Figure 10:
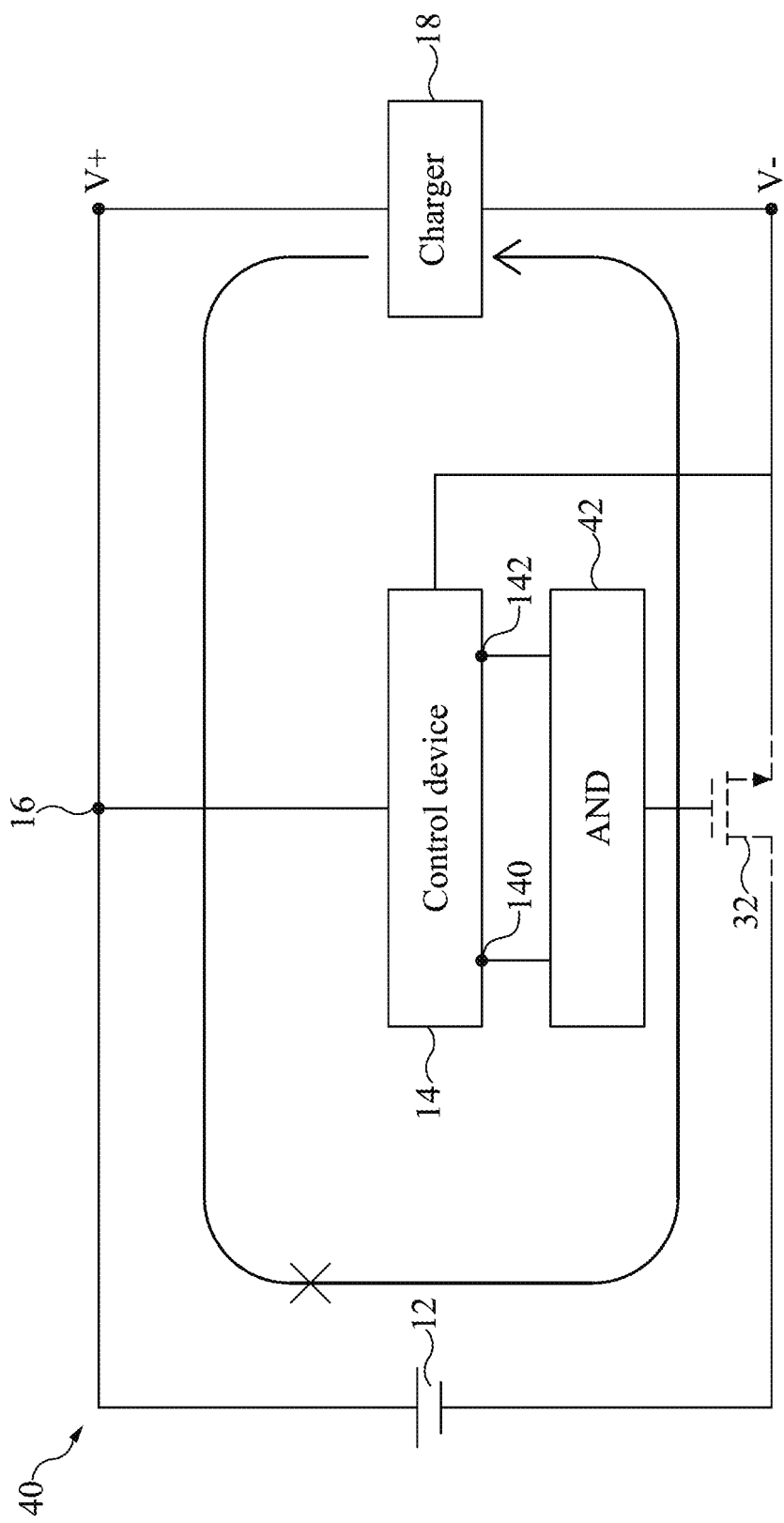
FIG. 10 is a schematic diagram illustrating an over-charge protection mechanism of the charging system shown in FIG. 8, in accordance with some embodiments of the present disclosure.

FIG. 10 is a schematic diagram illustrating an over-charge protection mechanism of the charging system 40 shown in FIG. 8, in accordance with some embodiments of the present disclosure. Referring to FIG. 10, the control device 14 determines that the battery voltage achieves a threshold voltage, which means that an undesired over-charge circumstance may occur. As such, to activate the over-charge protection mechanism, the control device 14 functions to break the closed loop by controlling the transistor 32 to be not conducting.

Since the parasitic diode PD3 provides no conduction path between the first S/D 306 and the second S/D 310 of the transistor 32, when the transistor 32 is controlled to be not conducting, the transistor 32 is actually not conducting, unlike the power MOS transistors M1 and M2. Since the closed loop is broken, the charger 18 stops charging the battery 12. The undesired over-charge circumstance is avoided. In the charging system 40, only one transistor, the transistor 32, is required to complete the over-charge protection mechanism.

Figure 11:
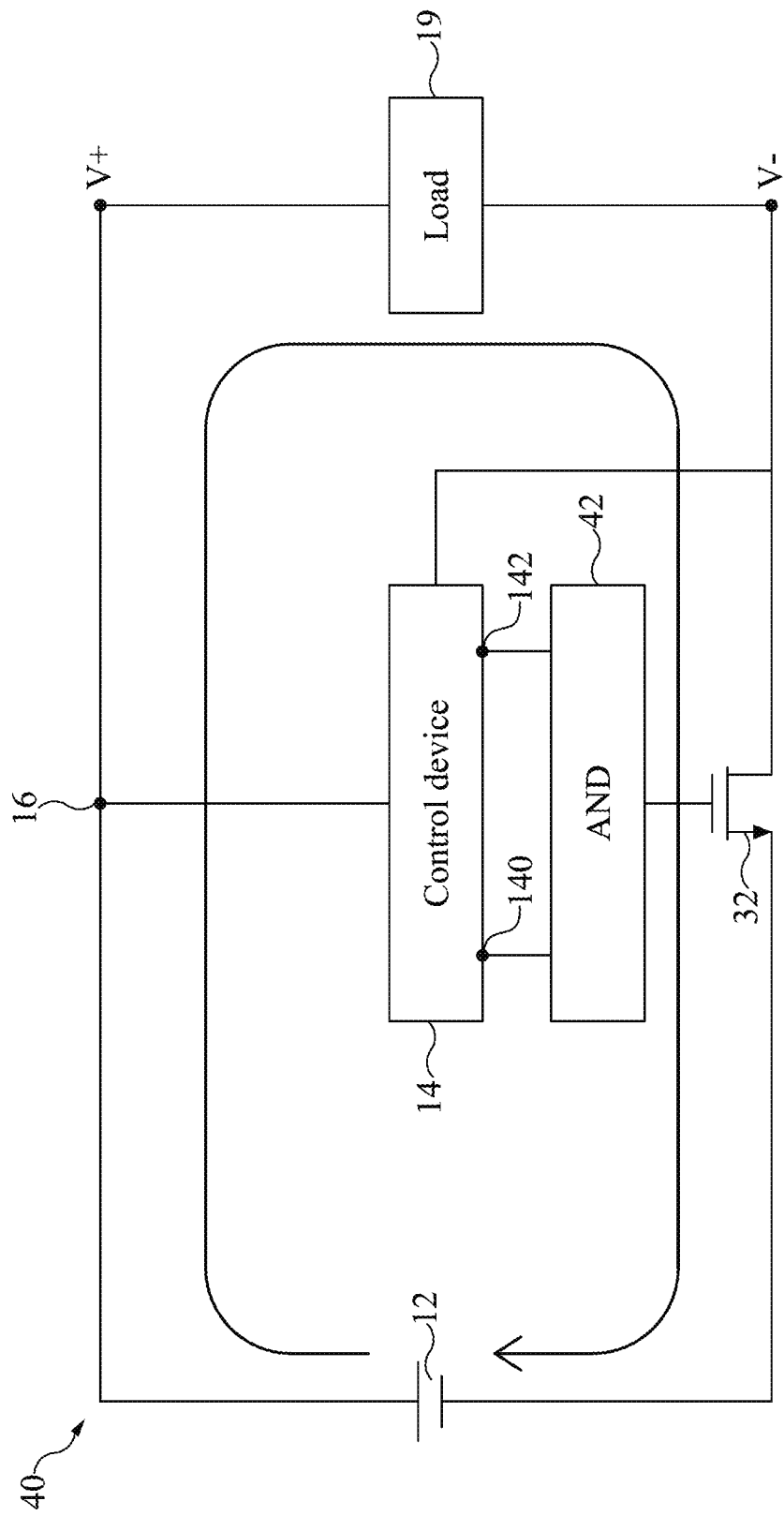
FIG. 11 is a schematic diagram illustrating a discharging behavior of the charging system shown in FIG. 8, in accordance with some embodiments of the present disclosure.

FIG. 11 is a schematic diagram illustrating a discharging behavior of the charging system 40 shown in FIG. 8, in accordance with some embodiments of the present disclosure. Referring to FIG. 11, a load 19 is adapted to the charging system 40 at ports V+ and V− of the charging system 40 for receiving electrical energy from the battery 12. Correspondingly, the battery 12 discharges. The control device 14 controls the transistor 32 to be conducting. As such, a closed loop is formed, and the battery 12 discharges to charge the load 19.

Figure 12:
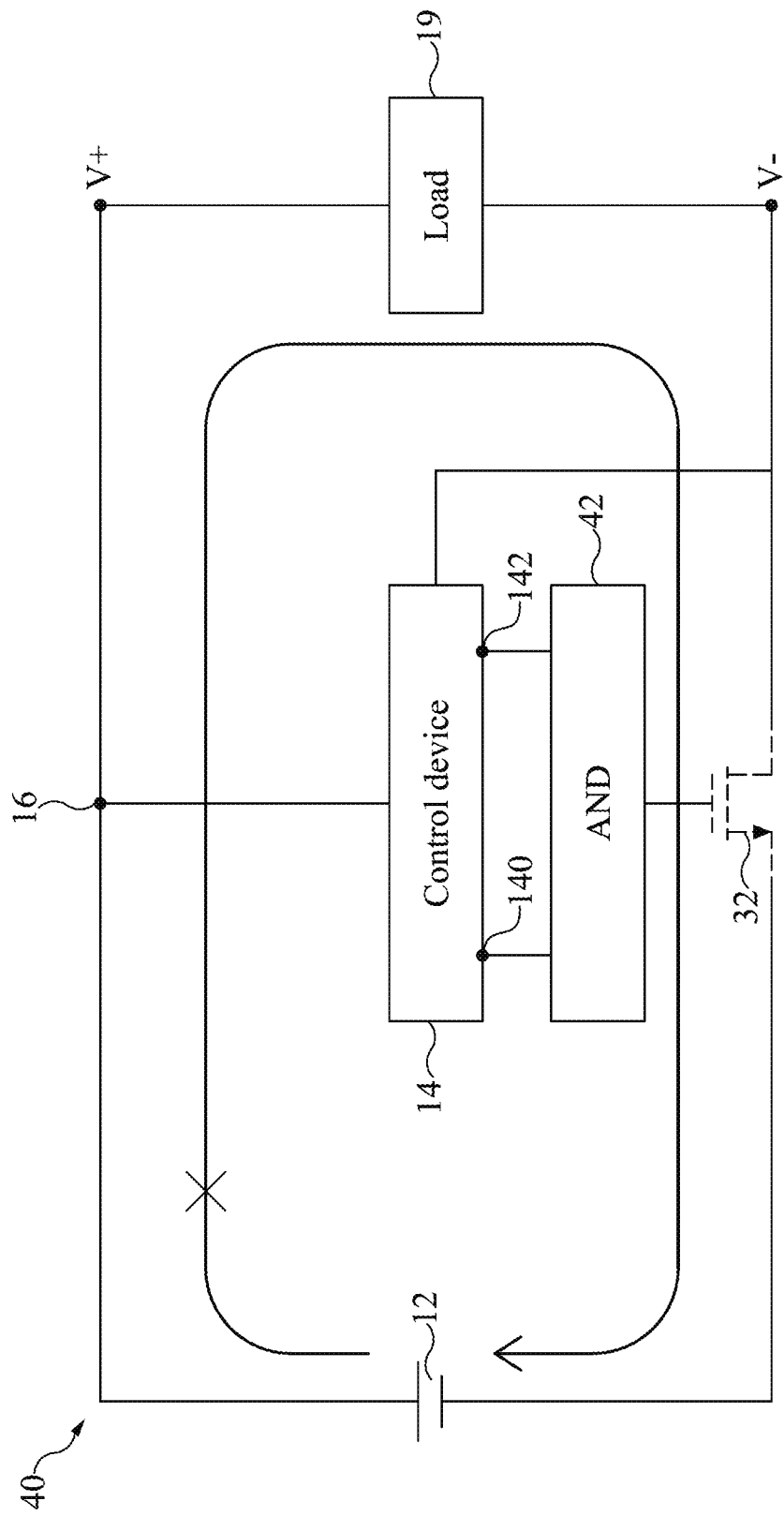
FIG. 12 is a schematic diagram illustrating an over-discharge protection mechanism of the charging system shown in FIG. 8, in accordance with some embodiments of the present disclosure.

FIG. 12 is a schematic diagram illustrating an over-discharge protection mechanism of the charging system 40 shown in FIG. 8, in accordance with some embodiments of the present disclosure. Referring to FIG. 12, the control device 14 determines that the battery voltage achieves another threshold voltage, which means that an undesired over-discharge circumstance may occur. As such, to activate the over-discharge protection mechanism, the control device 14 functions to break the closed loop by controlling the transistor 32 to be not conducting.

Since the diode PD3 provides no conduction path between the first S/D 306 and the second S/D 310 of the transistor 32, when the transistor 32 is controlled to be not conducting, the transistor 32 is actually not conducting, unlike the power MOS transistors M1 and M2. Since the closed loop is broken, the battery 12 stops discharging. The undesired over-discharge circumstance is avoided. In the charging system 40, only one transistor, the transistor 32, is required to complete the over-discharge protection mechanism.

Figure 13:
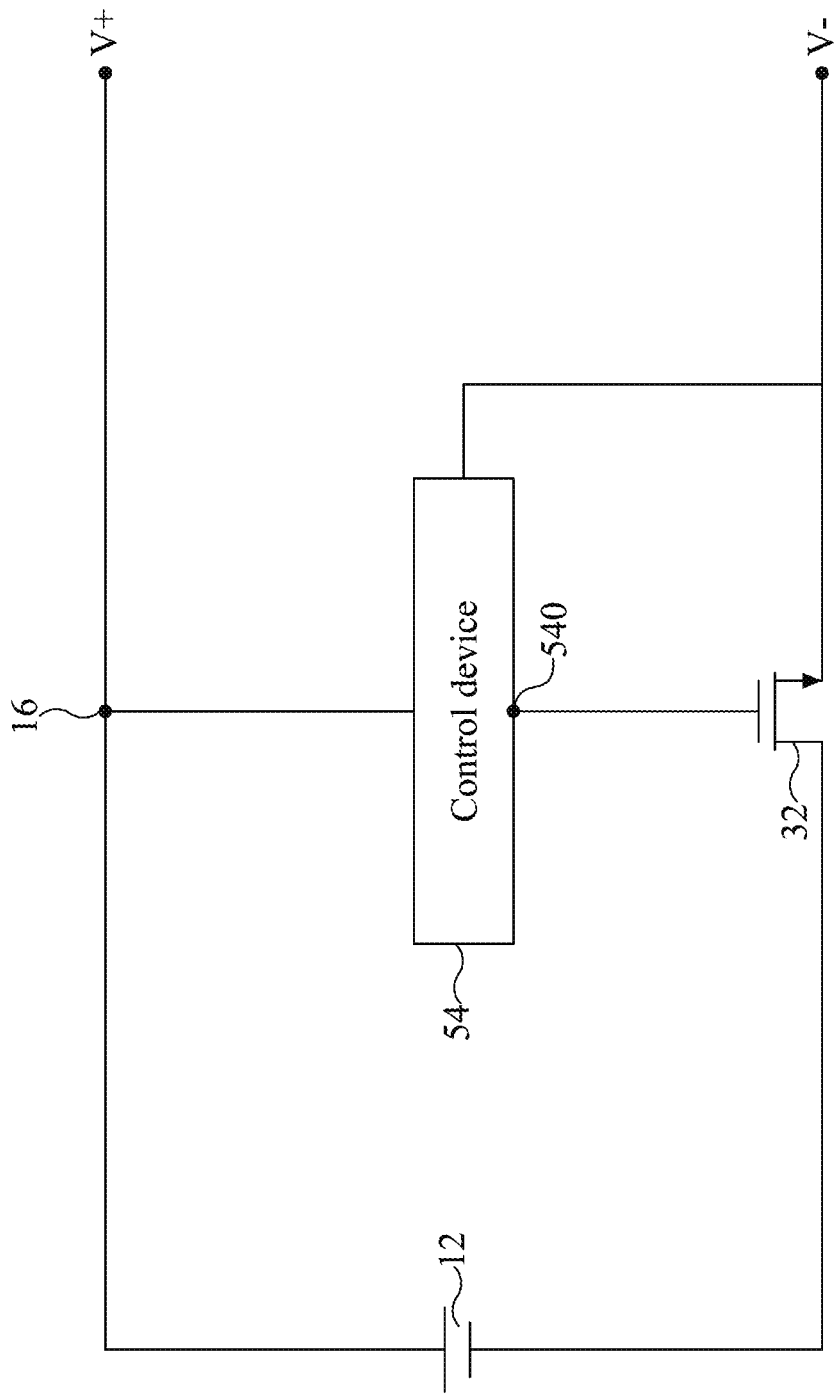
FIG. 13 is a schematic diagram of another charging system applied with the transistor shown in FIG. 7, in accordance with some embodiments of the present disclosure.

FIG. 13 is a schematic diagram of another charging system 50 applied with the transistor 32 shown in FIG. 7, in accordance with some embodiments of the present disclosure. Referring to FIG. 13, the charging system 50 is similar to the charging system 40 described and illustrated with reference to FIG. 8 except that, for example, the charging system 50 includes a control device 54 with one output port 540. The control device 54 controls the conducting state of the transistor 32 via, the one output port 540.

Figure 14:
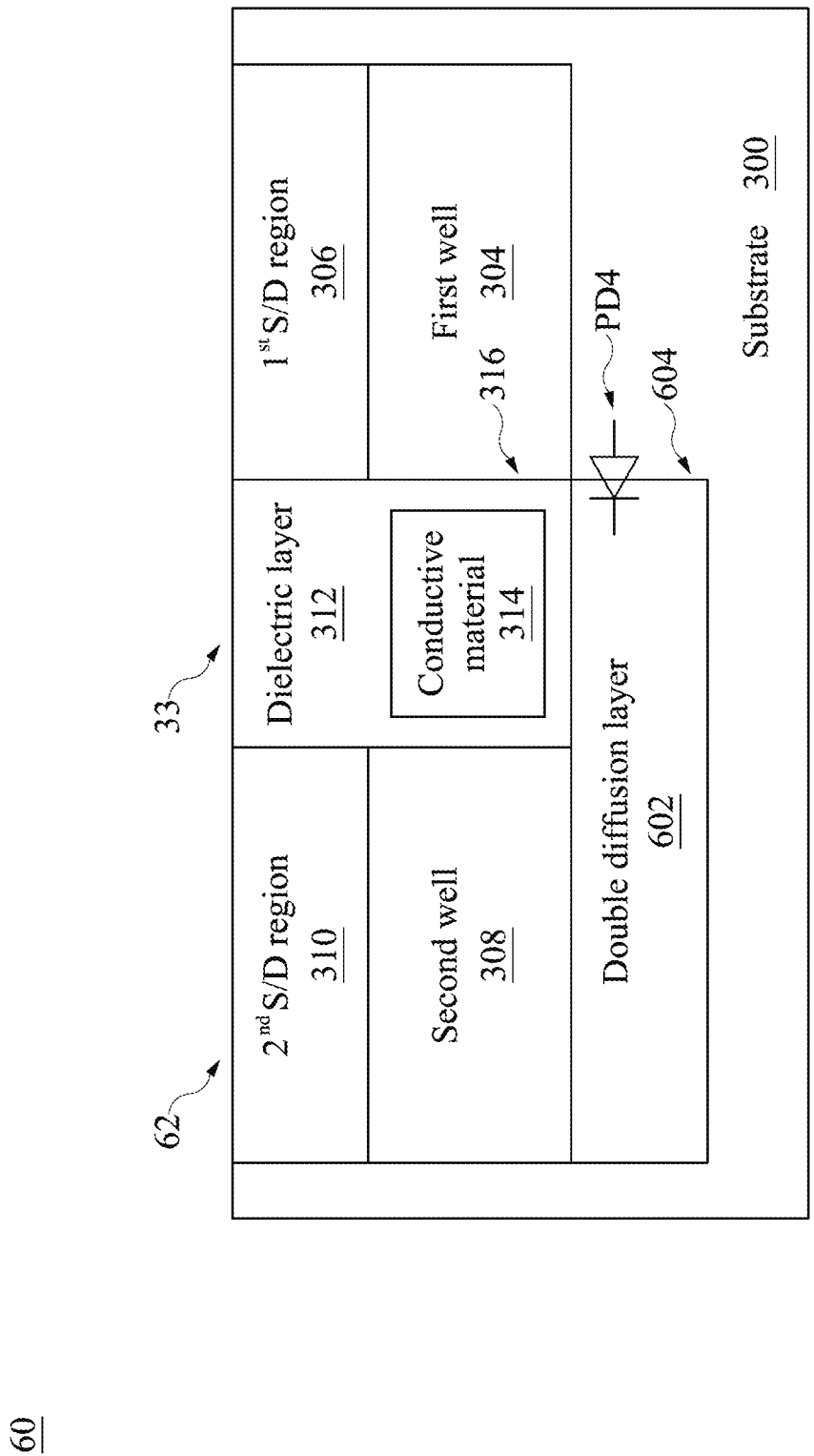
FIG. 14 is a cross-sectional diagram of a semiconductor device including another transistor, in accordance with some embodiments of the present disclosure.

FIG. 14 is a cross-sectional diagram of a semiconductor device 60 including another transistor 62, in accordance with some embodiments of the present disclosure. Referring to FIG. 14, the transistor 62 is similar to the transistor 32 described and illustrated with reference to FIG. 7 except that, for example, the transistor 62 includes a double diffusion layer 602. A side surface 604 of the double diffusion layer 602 is aligned with a sidewall 316 of the gate structure 33. A parasitic diode PD4, analogous to the parasitic diode PD3 described and illustrated with reference to FIG. 7, is defined by the substrate 300 and the double diffusion layer 602.

The transistor 62 can also be applied to the charging system 40, and provides the same benefits as the transistor 32.

Figure 15:
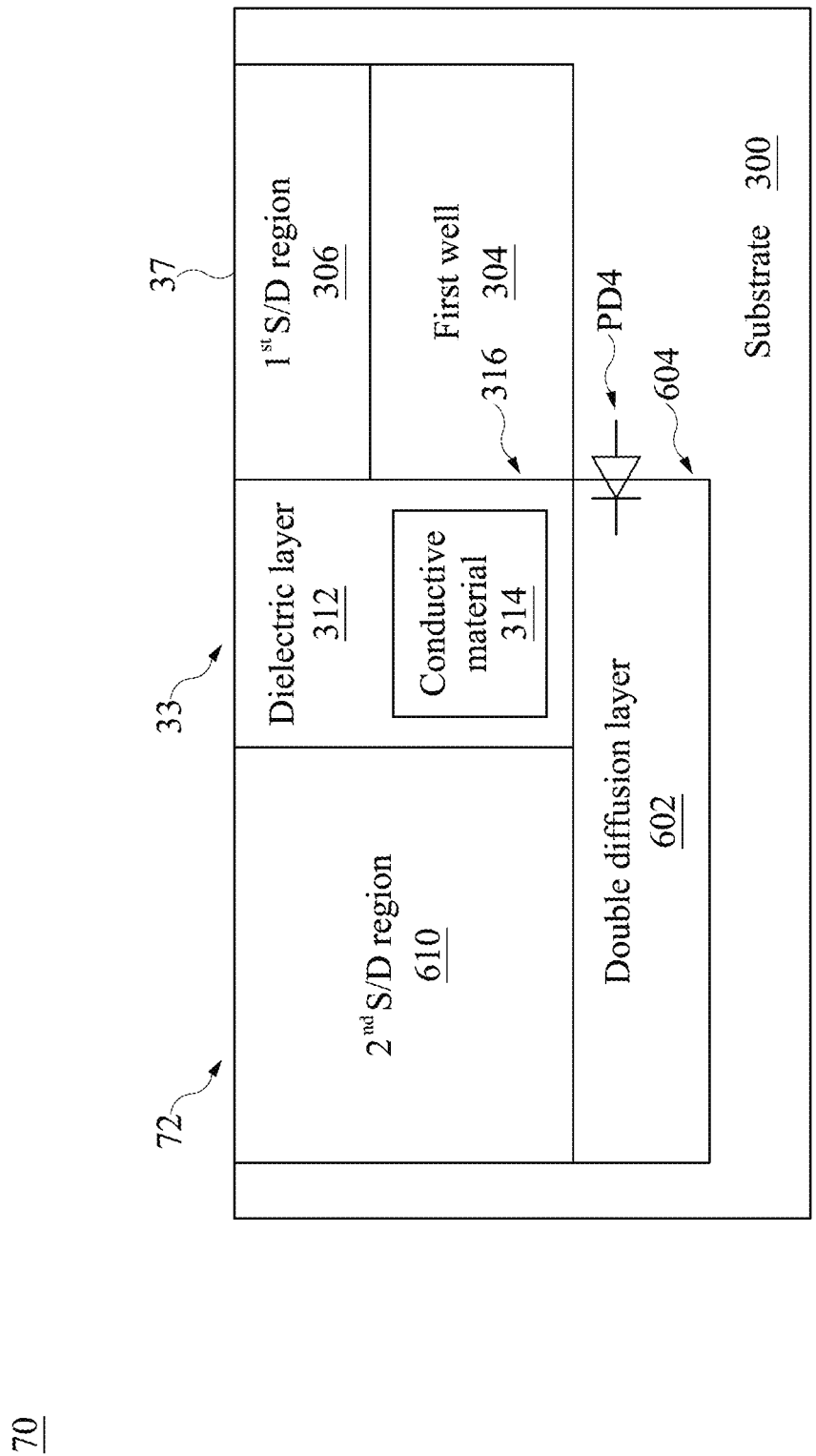
FIG. 15 is a cross-sectional diagram of a semiconductor device including still another transistor, in accordance with some embodiments of the present disclosure.

FIG. 15 is a cross-sectional diagram of a semiconductor device 70 including still another transistor 72, in accordance with some embodiments of the present disclosure. Referring to FIG. 15, the transistor 72 is similar to the transistor 62 described and illustrated with reference to FIG. 14 except that, for example, the transistor 72 includes a second S/D region 610 and is free of the second well 308 described in the embodiment of FIG. 14.

The second S/D region 610 extends from a top surface 37 of the substrate 300 to the double diffusion layer 602, and is in contact with the double diffusion layer 602.

The transistor 72 can also be applied to the charging system 40, and provides the same benefits as the transistor 32.

In the present disclosure, the transistor 32 is free of a body region in the first well 304. Consequently, there is no need to provide a conductive layer, like the metal layer 215 shown in FIG. 1, to connect the nonexistent body region to the first S/D region 306 or the second S/D region 310 so as to bias the nonexistent body region.

Although the diode PD3 is defined at a junction between the first well 304 and the double diffusion layer 302, in the absence of the body region and the conductive layer, the anode of the diode PD3 is not short-circuited to the first S/D region 306. As such, the diode PD3 does not provide a conduction path between the double diffusion layer 302 and the first S/D region 306, or between the second S/D region 310 and the first S/D region 306. As a result, even though a charging system only adopts one transistor 32, an over-charge protection mechanism and an over-discharge protection mechanism of the charging system still function normally. Moreover, because no body region is required, a semiconductor manufacturing process is relatively simple.

In contrast, because of the limitation of the semiconductor structure of the power MOS transistor M0, to avoid failure of the over-charge protection mechanism and the over-discharge protection mechanism, two power MOS transistors M0 are required. Moreover, to control two power MOS transistors M0, a design of the charging system 10 is relatively complicated.

One aspect of the present disclosure provides a semiconductor device. The semiconductor device includes a transistor. The transistor includes a first source/drain (S/D) region, a second S/D region and a gate structure. The first S/D region is defined in a first well on a double diffusion layer, wherein the first well and the double diffusion layer define a diode at a junction therebetween, wherein an anode of the diode and the first S/D region forms an open circuit therebetween. The gate structure is between the first S/D region and the second S/D region.

Another aspect of the present disclosure provides a semiconductor device. The semiconductor device includes a transistor. The transistor includes a first source/drain (S/D) region, a second S/D region and a gate structure. The first S/D region in a first well on a double diffusion layer. The first well and the double diffusion layer are defined in a substrate. The first well has a dopant type opposite to that of the double diffusion layer. The first S/D region is entirely defined in a portion of the first well in proximity to a top surface of the substrate. The gate structure is between the first S/D region and the second S/D region.

Another aspect of the present disclosure provides a charging system. The charging system includes the transistor; a battery; and a control device configured to, in response to a battery voltage of the battery, control a conductive state of the transistor.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device, comprising:
   a transistor including:
   a first source/drain (S/D) region defined in a first well on a double diffusion layer, wherein the first well and the double diffusion layer define a diode at a junction therebetween, and the first well is free of a body region of the transistor, wherein an anode of the diode and the first S/D region forms an open circuit therebetween, wherein the doping concentration in an upper portion of the double diffusion layer is higher than the doping concentration in a lower portion of the double diffusion layer;
   a second S/D region defined in a second well on the double diffusion layer, wherein the second S/D region has the same dopant type as the second well; and
   a gate structure between the first S/D region and the second S/D region.

2. The semiconductor device of claim 1, wherein the semiconductor device is free of a body region of the transistor.

3. The semiconductor device of claim 1, wherein the semiconductor device is free of a conductive layer connecting the first S/D region to the first well.

4. The semiconductor device of claim 1, wherein the second S/D region has the same dopant type as the double diffusion layer, and the first well has a dopant type opposite to that of the double diffusion layer.

5. The semiconductor device of claim 4, wherein the first S/D region has an n-type dopant, the first well has a p-type dopant, the double diffusion layer has an n-type dopant, the second well has an n-type dopant, and the second S/D region has an n-type dopant.

6. The semiconductor device of claim 1, wherein the first S/D region is level with the second S/D region.

7. The semiconductor device of claim 1, wherein the first well has a dopant type opposite to that of the second well.

8. The semiconductor device of claim 1, wherein the first well is defined in a substrate and the first S/D region is entirely defined in a portion of the first well in proximity to a top surface of the substrate.

9. A charging system, comprising:
   the transistor of claim 1;
   a battery; and
   a control device configured to, in response to a battery voltage of the battery, control a conductive state of the transistor.

10. The charging system of claim 9, wherein when the battery voltage exceeds a threshold voltage, the control device controls the transistor to be not conducting.

11. The charging system of claim 9, wherein when the battery voltage is lower than a threshold voltage, the control device controls the transistor to be not conducting.

12. The charging system of claim 9, wherein the control device includes only one output port connected to the transistor.

13. A semiconductor device, comprising:
    a transistor including:
    a first source/drain (S/D) region in a first well on a double diffusion layer, the first well and the double diffusion layer defined in a substrate, the first well having a dopant type opposite to that of the double diffusion layer, wherein the first S/D region is entirely defined in a portion of the first well in proximity to a top surface of the substrate, and the first well is free of a body region of the transistor, wherein the doping concentration in an upper portion of the double diffusion layer is higher than the doping concentration in a lower portion of the double diffusion layer;
    a second S/D region; and
    a gate structure between the first S/D region and the second S/D region.

14. The semiconductor device of claim 13, wherein the first well has a dopant type opposite to that of the first S/D region.

15. The semiconductor device of claim 13, wherein the second S/D region is defined in a second well on the double diffusion layer, wherein the second S/D region has the same dopant type as the second well and the double diffusion layer.

16. The semiconductor device of claim 15, wherein the first well has a dopant type opposite to that of the second well.

17. The semiconductor device of claim 15, wherein the first S/D region has an n-type dopant, the first well has a p-type dopant, the double diffusion layer has an n-type dopant, the second well has an n-type dopant, and the second S/D region has an n-type dopant.

18. The semiconductor device of claim 13, wherein the first S/D region is level with the second S/D region.

* * * * *